United States Patent [19]

Whatley et al.

[11] Patent Number: 5,083,051
[45] Date of Patent: Jan. 21, 1992

[54] OUTPUT DRIVER CIRCUIT WITH IMPROVED OUTPUT STAGE BIASING

[75] Inventors: Roger A. Whatley, Georgetown; Mathew A. Rybicki, Austin, both of Tex.

[73] Assignee: Motorola, Inc., Schaumburg, Ill.

[21] Appl. No.: 484,955

[22] Filed: Feb. 26, 1990

[51] Int. Cl.[5] .......................................... H03K 17/687
[52] U.S. Cl. .................................... 307/571; 307/262; 307/270; 307/494; 330/252; 330/253
[58] Field of Search ............... 307/270, 491, 494, 362, 307/571; 330/252, 253

[56] References Cited

U.S. PATENT DOCUMENTS

| | | | |
|---|---|---|---|
| 4,053,795 | 7/1976 | Cochran | 330/253 |
| 4,274,060 | 6/1981 | Kawanabe | 330/252 |
| 4,333,058 | 6/1982 | Hoover | 330/253 |
| 4,443,717 | 4/1984 | Haque | 307/362 |
| 4,539,494 | 9/1985 | Kurafuji | 307/362 |
| 4,818,897 | 4/1989 | Krenik | 330/253 |
| 4,888,559 | 12/1989 | Sevenhans et al. | 330/253 |
| 4,963,387 | 10/1990 | Dedic | 320/253 |
| 4,970,471 | 11/1990 | Taylor | 330/253 |
| 4,988,888 | 1/1991 | Hirose et al. | 307/270 |

FOREIGN PATENT DOCUMENTS

| | | | |
|---|---|---|---|
| 0123275 | 10/1984 | European Pat. Off. | 330/253 |
| 0166313 | 12/1980 | Japan | 330/253 |
| 0031211 | 3/1981 | Japan | 330/253 |
| 0234110 | 8/1986 | Japan | 330/253 |
| 0295709 | 12/1986 | Japan | 330/253 |

OTHER PUBLICATIONS

Cate, "Composite op amp Outperforms FET-Input ICS", pp. 151–154, 5/27/81.
A Highly Linear CMOS Buffer Amplifier, by John A. Fisher and Rudolf Koch, IEEE Journal of Solid-State Circuits, vol. SC-22, No. 3, Jun. 3, 1987, pp. 330–334.
Sallaerts, D. et al., "A Single-Chip U Interface Transceiver for ISDN," IEEE Journal of Solid-State Circuits, vol. SC-22, No. 6, Dec. 1987, pp. 1011–1021.

Primary Examiner—Stanley D. Miller
Assistant Examiner—Terry D. Cunningham
Attorney, Agent, or Firm—Paul J. Polansky

[57] ABSTRACT

An output driver circuit with improved output stage clamping comprises an input stage, an output stage, and a clamping circuit. The input stage amplifies a difference between an input signal and a reference signal to provide first and second output signals for driving gates of first and second transistors which together form the output stage. The first and second transistors are serially coupled between first and second power supply voltage terminals and provide an output signal. The clamping circuit clamps the first signal at a predetermined gate-to-source voltage below the first power supply voltage, and clamps the second signal at a predetermined gate-to-source voltage above the second power supply voltage terminal. The clamp voltages are maintained by matching current densities and bias conditions between the first and second transistors, and corresponding transistors in the clamping circuit.

12 Claims, 2 Drawing Sheets

OUTPUT DRIVER CIRCUIT WITH IMPROVED OUTPUT STAGE BIASING

FIELD OF THE INVENTION

This invention relates generally to output driver circuits, and more particularly, to output driver circuits which require low power and low crossover distortion.

BACKGROUND OF THE INVENTION

Certain output driver circuits in telecommunications integrated circuits drive highly loaded transmission lines or telephone cables. Such an output driver amplifies a relatively weak input signal to provide an output signal. The output driver must provide the output signal on the transmission line with a minimum amount of distortion while consuming the least amount of power. In order to minimize power consumption, it is desirable to operate the amplifier as a class AB amplifier, in which the current in the output devices is small when the output is near a crossover voltage. The crossover voltage may be an analog ground reference voltage about halfway between positive and negative power supply voltages. Crossover distortion occurs when the time-varying output signal is near the crossover voltage, because the gain characteristic of the output stage providing the output signal is non-linear around the crossover voltage, and the output signal shows a similar distortion.

For example, a common-source class AB output stage comprises two large CMOS transistors coupled in series between the positive and negative power supply voltage terminals. In class AB operation, the transistors in the output stage usually have at least some minimum bias applied to them, so that the gate-to-source voltage ($V_{GS}$) of the transistors will be slightly greater than their threshold voltages, and any nonlinearities in the current/voltage characteristics are minimized. Also, class AB operation provides a small DC quiescent current and thus reduces power consumption. If the $V_{GS}$ of each of the transistors is slightly greater than its respective threshold voltage, a small standby current flows in the output stage when the output signal is at crossover. One way the transistors may be kept partially conductive is by clamping the voltage on their gates at a $V_{GS}$ of slightly greater than a threshold voltage.

Clamping circuits may be used to thus maintain low power and low crossover distortion, and known clamping circuits function quite well for larger geometry integrated circuit technology. Transistors inside the clamping circuit provide clamp voltages for the transistors in the output stage. Since the transistors in the output stage are large, it is desirable for the transistors in the clamping circuit to be smaller to avoid high power consumption and increased circuit area. The clamp voltages are maintained by matching the current densities between the transistors in the output stage and the smaller-sized transistors in the clamping circuit. However, as channel lengths become smaller, approaching one micron and below, channel length modulation becomes more significant. Channel length modulation may cause the density of the current flowing in the output stage transistor to vary by as much as an order of magnitude from the density of the current flowing in the clamping circuit transistors. Thus, with short channel length transistors, known clamping circuits no longer provide an accurate clamp voltage for the transistors in the output stage, and crossover distortion and high currents again become a problem.

BRIEF DESCRIPTION OF THE INVENTION

Accordingly, it is an object of the present invention to provide an improved output driver circuit with low crossover distortion and low power dissipation.

It is another object of the present invention to provide an output driver circuit and method of use having improved clamping of an output stage.

It is yet another object of the present invention to provide an output driver circuit with low crossover distortion and low power dissipation for use in small geometry CMOS technologies.

In carrying out these and other objects of the invention, there is provided, in one form, an output driver circuit comprising an input stage, an output stage, and a clamping portion. The input stage provides a first signal proportional to a difference between an input signal and a first reference signal and provides a second signal proportional to a difference between the input signal and a second reference signal. The output stage has first and second transistors coupled in series between first and second power supply voltage terminals for respectively receiving the first and second signals and providing an output signal at a node between the first and second transistors. The clamping portion comprises a third transistor, clamps the second signal at a voltage substantially equal to the second power supply voltage plus a gate-to-source voltage of the third transistor the third transistor having substantially equal current density and drain-to-source voltage as the second transistor at crossover.

These and other objects, features and advantages will be more clearly understood from the following detailed description taken in conjunction with the accompanying drawings.

DETAILED DESCRIPTION OF THE INVENTION

Figure 1:
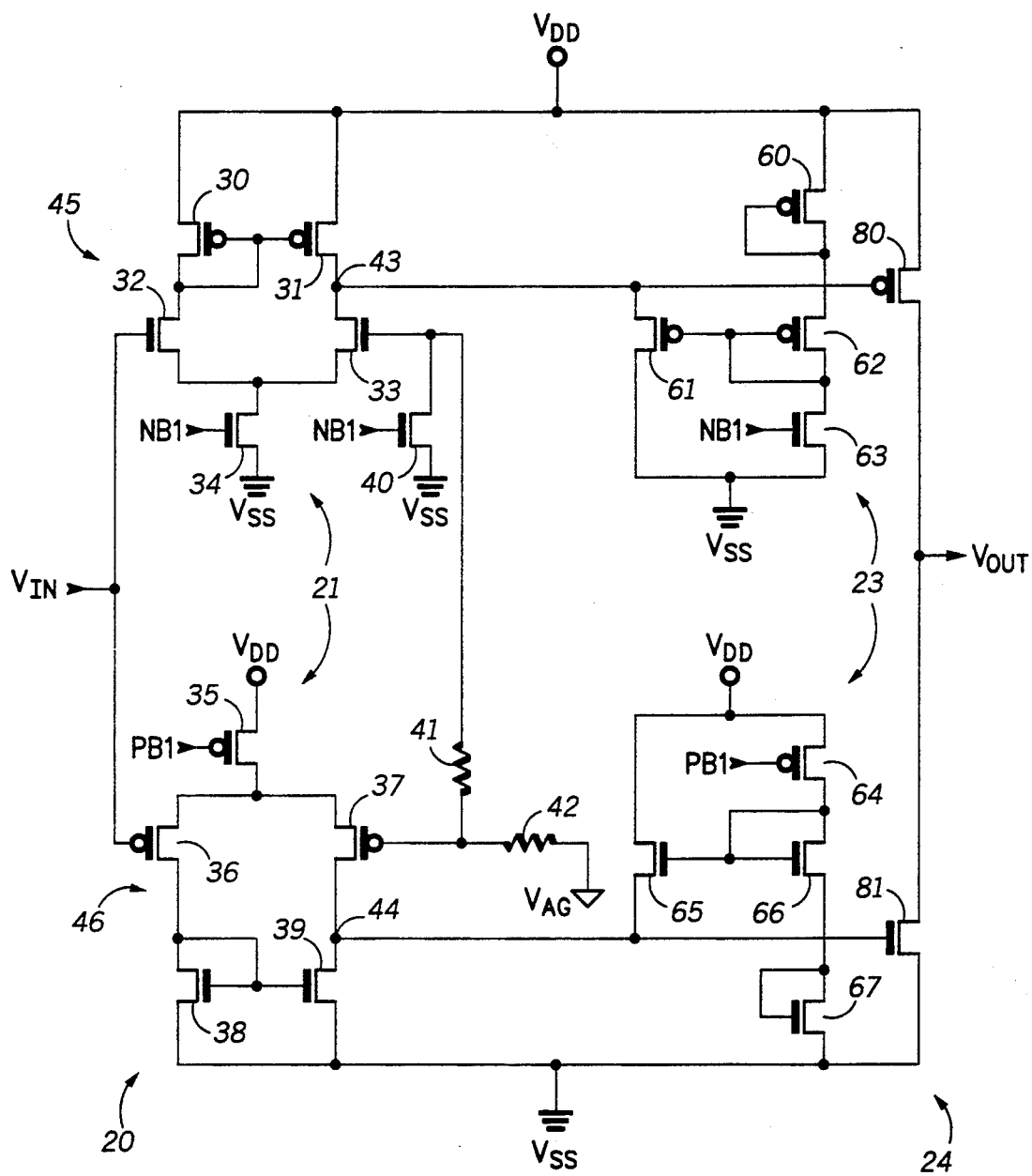
FIG. 1 illustrates in schematic form a known implementation of an output driver circuit.

FIG. 1 illustrates in schematic form a known implementation of an output driver circuit 20 with voltage clamping in an output stage. Output driver circuit 20 generally comprises an input stage 21, a clamping portion 23, and an output stage 24. Input stage 21 comprises P-channel transistors 30 and 31, N-channel transistors 32–34, a P-channel transistors 35–37, N-channel transistors 38–40, and resistors 41 and 42. Clamping portion 23 comprises P-channel transistors 60–62, an N-channel transistor 63, a P-channel transistor 64, and N-channel transistors 65–67. Output stage 24 comprises a P-channel transistor 80, and an N-channel transistor 81.

In input stage 21, transistor 30 has a source connected to a power supply voltage terminal labelled "$V_{DD}$", a gate, and a drain connected to the gate of transistor 30. $V_{DD}$ is a positive power supply voltage terminal and is typically 5 volts. Transistor 31 has a source connected to $V_{DD}$, a gate connected to the drain of transistor 30, and a drain connected to a node 43. Transistor 32 has a drain connected to the drain of transistor 30, a gate for receiving an input signal labelled "$V_{IN}$", and a source.

Transistor 33 has a drain connected to the drain of transistor 31, a gate, and a source. Transistor 34 has a drain connected to the sources of transistors 32 and 33, a gate for receiving a bias signals labelled "NB1", and a source connected to a power supply voltage terminal labelled "$V_{SS}$". $V_{SS}$ is a negative power supply voltage terminal and is approximately zero volts.

Transistor 35 has a source connected to $V_{DD}$, a gate for receiving a bias signal labelled "PB1", and a drain. Transistor 36 has a source connected to the drain of transistor 35, a gate for receiving $V_{IN}$, and a drain. Transistor 37 has a source connected to the drain of transistor 35, a gate, and a drain connected to a node 44. Transistor 38 has a drain connected to the drain of transistor 36, a gate connected to the drain of transistor 38, and a source connected to $V_{SS}$. Transistor 39 has a drain connected to the drain of transistor 37, a gate connected to the drain of transistor 36, and a source connected to $V_{SS}$.

Transistor 40 has a drain connected to the gate of transistor 33, a gate for receiving bias signal NB1, and a source connected to $V_{SS}$. Resistor 41 has a first terminal connected to the drain of transistor 40, and a second terminal connected to the gate of transistor 37. Resistor 42 has a first terminal connected to the second terminal of resistor 41, and a second terminal connected to a reference voltage terminal labelled "$V_{AG}$". $V_{AG}$ is an analog ground reference voltage terminal and is approximately half of $V_{DD}$.

Transistor 60 has a source connected to $V_{DD}$, a gate, and a drain connected to the gate of transistor 60. Transistor 61 has a source connected to the drain of transistor 31, a gate, and a drain connected to $V_{SS}$. Transistor 62 has a source connected to the drain of transistor 60, a gate connected to the gate of transistor 61, and a drain connected to the gates of transistors 61 and 62. Transistor 63 has a drain connected to the drain of transistor 62, a gate for receiving bias signal NB1, and a source connected to $V_{SS}$. Transistor 64 has a source connected to $V_{DD}$, a gate for receiving PB1, and a drain. Transistor 65 has a drain connected to $V_{DD}$, a gate connected to the drain of transistor 64, and a source connected to the drain of transistor 37. Transistor 66 has a drain connected to the drain of transistor 64, a gate connected to the gate of transistor 65 and to the drain of transistor 64, and a source. Transistor 67 has a drain connected to the source of transistor 66, a gate connected to the source of transistor 66, and a source connected to $V_{SS}$.

Transistor 80 has a source connected to $V_{DD}$, a gate connected to the drain of transistor 31, and a drain for providing an output signal labelled "$V_{OUT}$". Transistor 81 has a drain connected to the drain of transistor 80, a gate connected to the drain of transistor 37, and a source connected to $V_{SS}$.

Output driver circuit 20 amplifies an input signal $V_{IN}$ to provide an output signal $V_{OUT}$ with low crossover distortion and low quiescent power dissipation. The low crossover distortion is maintained by clamping the voltages on nodes 43 and 44 so that the $V_{GS}$ of transistor 80 and the $V_{GS}$ of transistor 81, respectively, always remain slightly above their respective threshold voltages. However, output driver circuit 20 loses its ability to keep the $V_{GS}$ of transistors 80 and 81 near their threshold voltages when gate lengths become too small, as described below.

Transistors 30–34 form a difference amplifier 45 which amplifies a difference between $V_{IN}$ and the voltage on the gate of transistor 33 to provide a non-inverted voltage on node 43. The voltage on the gate of transistor 33 is approximately, but not exactly, equal to $V_{AG}$. Similarly, transistors 35–39 form a difference amplifier 46 which amplifies a difference between $V_{IN}$ and the voltage on the gate of transistor 37 to provide a non-inverted voltage on node 44, and the voltage on the gate of transistor 37 is approximately, but not exactly, equal to $V_{AG}$.

If $V_{IN}$ exceeds $V_{AG}$, the voltage on node 44 rises above its corresponding clamp voltage by an amount determined by a voltage gain of difference amplifier 46. At the same time, node 43 is clamped by transistor 61 to maintain a constant bias current in transistor 80. Transistor 81 is now more conductive than transistor 80 and the voltage on $V_{OUT}$ falls. If $V_{IN}$ falls below $V_{AG}$, the voltage on node 43 falls below its corresponding clamp voltage by an amount determined by a voltage gain of difference amplifier 45. At the same time, node 44 is clamped by transistor 65 to maintain a constant bias current in transistor 81. Transistor 80 is now more conductive than transistor 81 and the voltage on $V_{OUT}$ rises.

Transistor 40 is biased to act as a current source by bias signal NB1 and draws current through resistors 41 and 42. Resistor 41 ensures a small voltage drop between the gates of transistors 33 and 37. This voltage drop introduces a small offset voltage which is nonetheless larger than a random offset voltage caused by manufacturing variations. The offset voltage induced by resistor 41 is large enough to exceed the random offset voltage of differential amplifiers 45 and 46. Resistor 42 furthermore ensures that the voltage on the gate of transistor 37 is not exactly equal to $V_{AG}$ either.

Clamping portion 23 causes output driver circuit 20 to operate in Class AB mode and reduces crossover distortion by keeping the $V_{GS}$ of transistors 80 and 81 near their respective thresholds during crossover. The crossover point occurs when signal $V_{IN}$ is at approximately $V_{AG}$. Transistor 61 prevents the voltage on node 43 from rising substantially above one threshold voltage of transistor 80 below $V_{DD}$. To understand this, consider the operation of transistors 60–63. Transistors 60 and 62 are diode-connected by the respective drains and gates being connected together. The voltage on the drain of transistor 60 is equal to a $V_{GS}$ that occurs while trying to source a predetermined current. Transistor 63 is biased by bias signal NB1 to sink the predetermined current. Similarly, the voltage on the drain of transistor 62 is equal to the voltage on the drain of transistor 60 less a $V_{GS}$ that occurs while trying to source the predetermined current. Therefore, the voltage on the gate of transistor 61 is equal to $V_{DD}$ minus the gate-to-source voltage of transistor 60, minus the gate-to-source voltage of transistor 62. As an example, assume that transistors 60, 61, and 62 have equal sizes, so that if the gate-to-source voltage of transistors 60–62 with the predetermined drain-to-source current is labelled $V_{GS1}$, the voltage on the gate of transistor 61 is ($V_{DD} - 2V_{GS1}$). Therefore, if the voltage on node 43 rises above ($V_{DD} - V_{GS1}$), transistor 61 will become substantially conductive, and clamp the voltage on node 43 at approximately ($V_{DD} - V_{GS1}$). Similarly, transistors 65–67 have the same size and if the gate-to-source voltage of transistors 65–67 with the predetermined drain-to-source current is labelled $V_{GS2}$, transistors 65 clamps the voltage on node 44 at approximately ($V_{SS} + V_{GS2}$).

The purpose of clamping the voltages at these values is to ensure the $V_{GS}$ of transistors 80 and 81 are always near their respective threshold voltages, and that the transistors never become fully nonconductive. Since the transistors are never fully nonconductive, when $V_{IN}$ is at approximately $V_{AG}$, $V_{OUT}$ is still being driven, and a standby current flows. In order to achieve that purpose, $V_{GS1}$ must equal the $V_{GS}$ of transistor 80 at crossover, and $V_{GS2}$ must equal the $V_{GS}$ of transistor 81 at crossover. Since transistors 80 and 81 are much larger than transistors 61-63 and 65-67, $V_{GS1}$ and $V_{GS2}$ must be made equal to the gate-to-source voltages of transistors 80 and 81 at crossover by matching the respective current densities. For example, if transistors 60 and 62 are sized to be one-tenth the size of transistor 80, the current provided by transistor 63 should be one-tenth of the current flowing through transistor 80 at crossover to provide substantially equal current densities. Transistors 63 and 64 are biased so that the respective current densities are substantially equal to the current densities of transistors 80 and 81 during crossover. Other ratios for transistor sizes and current densities may be used to modify the crossover currents in the output stage to minimize crossover distortion.

Clamping portion 23 keeps a standby current flowing through output stage 24 and maintains a low crossover distortion quite well for larger geometry integrated circuit technology. However, when channel lengths become smaller, channel length modulation occurs. Channel length modulation causes the $V_{GS}$ of a transistor at a given current density to depend on the drain-to-source voltage, or $V_{DS}$. Here, for example, channel width modulation causes the $V_{DS}$ of transistors 60 and 62 to be different from the $V_{DS}$ of transistor 80 during crossover. Therefore, the $V_{GS}$ of transistors 60 and 62 no longer substantially equal the $V_{GS}$ of transistor 80. Channel length modulation may cause the density of the current flowing in output stage transistor 80 to vary by up to an order of magnitude from the density of the current flowing through transistors 60 and 62 depending on the transistor ratios. Similarly, the density of the current flowing in output stage transistor 81 may vary by approximately an order of magnitude from the density of the current flowing transistors 66 and 67. If the current densities in the clamping circuit cannot properly track current densities in transistors 80 and 81, accurate $V_{GS}$ references provided by transistors 60, 62, 66, and 67 in the clamping circuit are lost. As a result, the $V_{GS}$ of transistors 80 and 81 may fall well below their respective clamping voltages at crossover, and worsen crossover distortion, or the $V_{GS}$ may fall well above the respective clamping voltages at crossover, and increase output currents and overall power dissipation.

Figure 2:
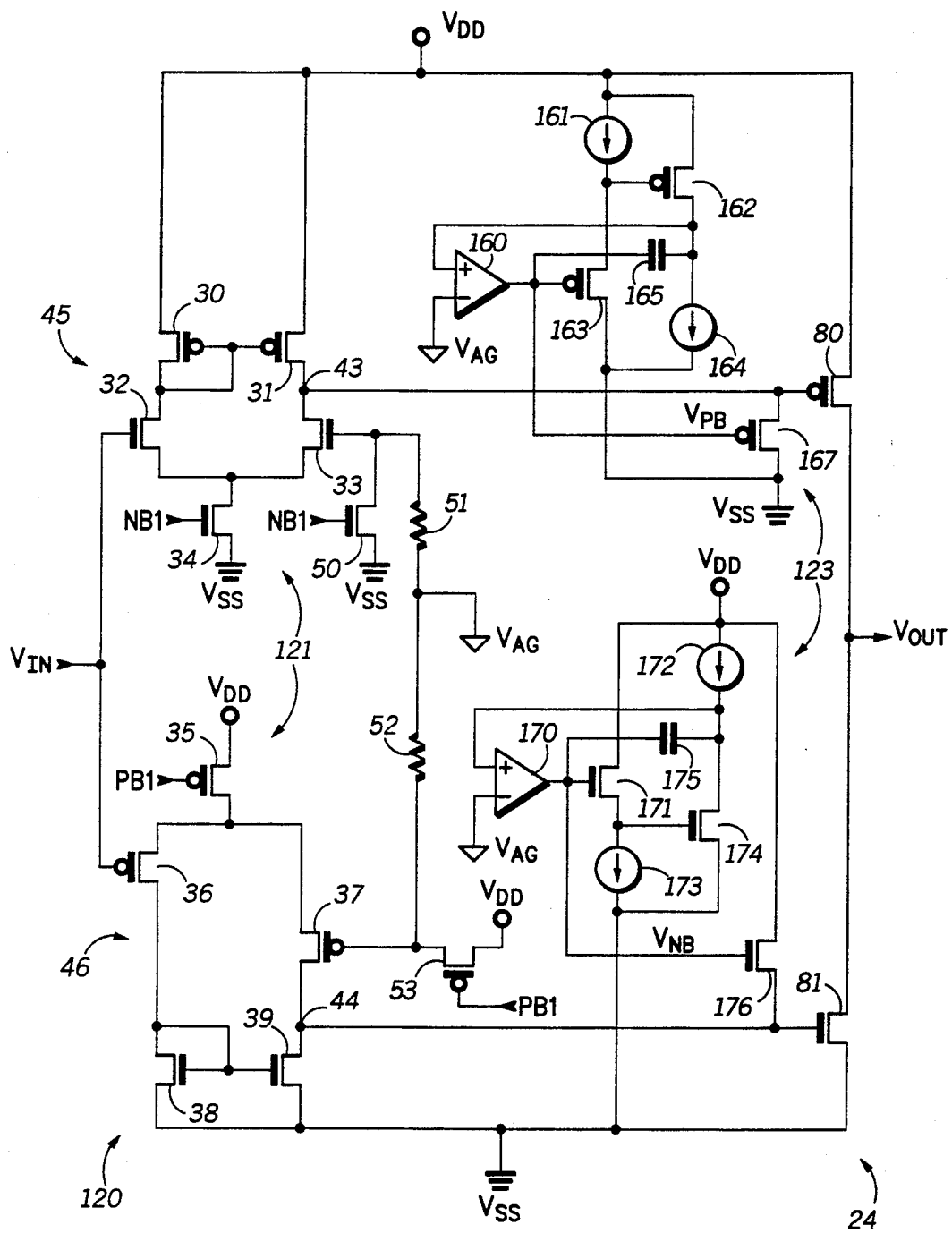
FIG. 2 illustrates in schematic form an output driver circuit in accordance with a preferred embodiment of the present invention.

FIG. 2 illustrates in schematic form an output driver circuit 120 in accordance with a preferred embodiment of the present invention. It should be noted that output driver circuit 120 is identical to output driver circuit 20 except that clamping portion 123 differs from clamping portion 23, and input portion 121 provides input reference voltages symmetrically around $V_{AG}$. For purposes of illustration convenience, identical elements between output driver circuit 20 and output driver circuit 120 retain their numbers as shown in FIG. 1, and operate as described in FIG. 1 also. Clamping portion 123 provides clamping at voltages that better approximate the gate-to-source voltages of transistors 80 and 81 when short channel length transistors are used, and thus ensures lower crossover distortion and better-controlled quiescent currents than output driver circuit 20 of FIG. 1.

In input portion 121, the reference voltages on the gates of transistors 33 and 37 are formed differently than in input portion 21 of FIG. 1. Input portion 121 thus comprises an N-channel transistor 50, resistors 51 and 52, and a P-channel transistor 53, instead of transistor 40 and resistors 41 and 42 of input portion 21 of FIG. 1. Transistor 50 has a drain connected to the gate of transistor 33, a gate for receiving NB1, and a source connected to $V_{SS}$. Resistor 51 has a first terminal connected to the drain of transistor 50, and a second terminal connected to $V_{AG}$. Resistor 52 has a first terminal connected to $V_{AG}$, and a second terminal connected to the gate of transistor 37. Transistor 53 has a source connected to $V_{DD}$, a gate for receiving PBIAS, and drain connected to the second terminal of resistor 52. Transistors 50 and 53 are biased to operate as current sources, and by conducting current from $V_{AG}$ to their respective power supply voltage terminals, transistors 50 and 53 cause voltage drops so that the voltage on the gate of transistor 33 is slightly below $V_{AG}$, and the voltage on the gate of transistor 37 is slightly above $V_{DD}$. The improvement is that the reference voltages are symmetrical around $V_{AG}$, unlike input portion of FIG. 1.

Clamping portion 123 comprises a differential amplifier 160, a current source 161, a P-channel transistor 162, a P-channel transistor 163, a current source 164, a capacitor 165, a P-channel transistor 167, a differential amplifier 170, an N-channel transistor 171, a current source 172, a current source 173, an N-channel transistor 174, a capacitor 175, and an N-channel transistor 176.

Differential amplifier 160 has a positive input terminal, a negative input terminal connected to $V_{AG}$, and an output terminal supplying a voltage labelled "$V_{PB}$". Current source 161 has a first terminal connected to $V_{DD}$, and a second terminal. Note that current sources 161, 164, 172, and 173 provide current in the direction from the first terminal to the second terminal. Current sources 161, 164, 172, and 173 each comprise a transistor biased by an appropriate voltage so that the transistor provides a substantially constant current (not shown), but other implementations of current sources are also possible. Transistor 163 has a source connected to the second terminal of current source 161, a gate connected to the output of differential amplifier 160, and a drain connected to $V_{SS}$. Transistor 162 has a source connected to $V_{DD}$, a gate connected to the second terminal of current source 161, and a drain connected to the positive input terminal of differential amplifier 160. Current source 164 has a first terminal connected to the drain of transistor 162, and a second terminal connected to $V_{SS}$. Note that no distinction is made between a current source and a current sink, since the direction of current flow indicates which direction the current source drives current. Capacitor 165 has a first terminal connected to the output terminal of differential amplifier 160, and a second terminal connected to the drain of transistor 162. Transistor 167 has a source connected to node 43, a gate connected to the output terminal of differential amplifier 160, and a drain connected to $V_{SS}$.

Differential amplifier 170 has a positive input terminal, a negative input terminal connected to $V_{AG}$, and an output terminal supplying a voltage labelled "$V_{NB}$". Transistor 171 has a drain connected to $V_{DD}$, a gate connected to the output terminal of differential amplifier 170, and a source. Current source 173 has a first terminal connected to the source of transistor 171, and a second terminal connected to $V_{SS}$. Current source 172 has a first terminal connected to $V_{DD}$, and a second terminal connected to the positive input terminal of differential amplifier 170. Transistor 174 has a drain connected to the second terminal of current source 172, a gate connected to the source of transistor 171, and a source connected to $V_{SS}$. Capacitor 175 has a first terminal connected to the output terminal of differential amplifier 170, and a second terminal connected to the second terminal of current source 172. Transistor 176 has a drain connected to $V_{DD}$, a gate connected to the output terminal of differential amplifier 170, and a source connected to node 44.

Differential amplifier 160 changes its output voltage $V_{PB}$ until the voltage on the positive input terminal thereof is equal to $V_{AG}$. Therefore voltage $V_{PB}$, the voltage supplied to the gate of transistor 163, causes the voltage on the drain of transistor 162 to be equal to $V_{AG}$. $V_{PB}$ is also used to bias transistor 167. Transistor 31 is sized to provide additional current which flows through transistor 167 to make transistors 163 and 167 respectively have substantially equal current densities. Since the gates of transistors 163 and 167 are both biased by voltage $V_{PB}$, the gate-to-source voltages of both transistors are equal. Furthermore, current source 164 ensures the current density of transistor 162 is equal to the current density of transistor 80 when $V_{OUT}$ is at $V_{AG}$, the crossover voltage, since the drain of transistor 162 is also at $V_{AG}$. The bias conditions of transistor 162 are thus the same as the bias conditions of transistor 80 at crossover. Capacitor 165 ensures stability by providing dominant pole compensation.

Assuming no channel length modulation, it can be easily shown that transistor 167 clamps the voltage on node 43 at $(V_{DD} - V_{GS80})$, where $V_{GS80}$ is the gate-to-source voltage of transistor 80 at crossover. Summing voltages around a loop, it can be seen that voltage $V_{PB}$ is equal to $(V_{DD} - V_{GS162} - V_{GS163})$. Transistor 163 has the same current density as transistor 167, so voltage $V_{PB}$ is equal to $(V_{DD} - V_{GS162} - V_{GS167})$. The voltage on node 43 needed to make transistor 167 substantially conductive is then $(V_{DD} - V_{GS162})$. Furthermore, the gate-to-source voltage $V_{GS162}$ is equal to $V_{GS80}$ since transistors 162 and 80 have the same current densities drain-to-source voltages at crossover. Therefore, transistor 167 becomes substantially conductive at a voltage greater than $(V_{DD} - V_{GS80})$, and clamps the voltage on node 43 at that voltage. This also allows the crossover current in output stage 24 to be controlled by a ratio of the gate widths of transistors 80 and 162.

In a like manner, differential amplifier 170 changes its output voltage $V_{NB}$ until the voltage on the positive input terminal is equal to $V_{AG}$. Therefore voltage $V_{NB}$, the voltage supplied to the gate of transistor 171, causes the voltage on the drain of transistor 174 to be equal to $V_{AG}$. $V_{NB}$ is also used to bias transistor 176. Transistor 39 is sized to provide additional current which flows through transistor 176 to make transistors 171 and 176 respectively have substantially equal current densities. Since the gates of transistors 171 and 176 are both biased by voltage $V_{NB}$, the gate-to-source voltages of both transistors are equal. Furthermore, current source 172 ensures the current density through transistor 174 is equal to the current density through transistor 81 when $V_{OUT}$ is at $V_{AG}$, the crossover voltage, since the drain of transistor 174 is also at $V_{AG}$. The bias conditions of transistor 174 are thus equal to the bias conditions of transistor 81 at crossover. Capacitor 175 ensures stability by providing dominant pole compensation.

Assuming no channel length modulation, it can be easily shown that transistor 176 clamps the voltage on node 44 at $(V_{SS} + V_{GS81})$, where $V_{GS81}$ is the gate-to-source voltage of transistor 81 at crossover. Summing voltages around a loop, it can be seen that voltage $V_{NB}$ is equal to $(V_{SS} + V_{GS174} + V_{GS171})$. Transistor 171 has the same current density as transistor 176, so voltage $V_{NB}$ is equal to $(V_{SS} + V_{GS176} + V_{GS174})$. The voltage on node 44 needed to make transistor 176 conductive is then $(V_{SS} + V_{GS174})$. Furthermore, gate-to-source voltage $V_{GS174}$ is equal to gate-to-source voltage $V_{GS81}$ since transistors 174 and 81 have the same current densities drain-to-source voltage at crossover. Therefore, transistor 176 becomes substantially conductive at a voltage less than $(V_{SS} + V_{GS81})$, and clamps the voltage on node 44 at that voltage.

The advantage of using clamping circuit 123 to clamp voltages on nodes 43 and 44 is that clamping circuit 123 overcomes the channel length modulation problem by matching the $V_{DS}$ of transistors in output stage 24 with corresponding reference transistors. Clamping circuit 123 ensures that corresponding transistors 162 and 174 maintain the same $V_{DS}$ as transistors 80 and 81, respectively, at crossover. The drain-to-source voltage of transistor 162 at bias, $V_{DS162}$, is equal to $(V_{DD} - V_{AG})$, and is the same $V_{DS}$ as transistor 80 at crossover. Similarly, the $V_{DS}$ of transistor 174 is equal to $(V_{AG} - V_{SS})$, which is the same $V_{DS}$ as transistor 81 at crossover.

It should be apparent that an output driver circuit has been described which provides an improved clamping circuit which is suitable for short channel length geometries. The clamping circuit uses closed loop feedback to provide a voltage on a gate of a clamping transistor which makes the clamping transistor clamp the gate of the corresponding transistor in the output stage at a gate-to-source voltage of the corresponding transistor in the clamping circuit. Providing a more accurate clamping bias signal allows the output driver circuit to operate with wider manufacturing process variations and under conditions of extremely high loading with low crossover distortion and better controlled output quiescent current.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A driver circuit comprising:
   an input stage for providing a first signal proportional to a difference between an input signal and a first reference signal, and for providing a second signal proportional to a difference between an input signal and a first reference signal, and for providing a second signal proportional to a difference between said input signal and a second reference signal;
   an output stage having first and second transistors coupled in series between first and second power supply voltage terminals for respectively receiving said first and second signals and providing an output signal at a node between said first and second transistors; and clamping means, comprising a third transistor and a regulator coupled to said third transistor, said regulator comprising a differential amplifier, for clamping said second signal at a voltage substantially equal to said second power supply voltage plus a gate-to-source voltage of said third transistor, and for biasing said third transistor to have substantially equal current density as said second transistor when said output signal equals a third reference voltage, said regulator regulating a voltage at a drain of said third transistor so that said third transistor has substantially equal drain-to-source voltage as said second transistor when said output signal equals said third reference voltage.

2. A driver circuit comprising:

an input stage for providing a first signal proportional to a difference between an input signal and a first reference signal, and for providing a second signal proportional to a difference between said input signal and a second reference signal;

an output stage having first and second transistors coupled in series between first and second power supply voltage terminals for respectively receiving said first and second signals and providing an output signal at a node between said first and second transistors; and clamping means, comprising a third transistor and a regulator coupled to said third transistor, said regulator comprising a differential amplifier, for clamping said first signal at a voltage substantially equal to said first power supply voltage plus a gate-to-source voltage of a third transistor, and for biasing said third transistor to have substantially equal current density as said first transistor when said output signal equals a third reference voltage, said regulator regulating a voltage at a drain of said third transistor so that said third transistor has substantially equal drain-to-source voltage as said first transistor when said output signal equals said third reference voltage.

3. The output driver circuit of claim 2, wherein said clamping means further comprises a fourth transistor and a second regulator coupled to said fourth transistor, said second regulator comprising a second differential amplifier, and also clamps said second signal at a voltage substantially equal to said second power supply voltage plus a gate-to-source voltage of said fourth transistor, and also biases said fourth transistor to have substantially equal current density as said second transistor when said output signal equals said third reference voltage, wherein said second regulator regulates a voltage at a drain of said fourth transistor so that said fourth transistor has substantially equal drain-to-source voltage as said second transistor when said output signal equals said third reference voltage.

4. In a driver circuit comprising an input stage for providing a first signal, conducted by a first signal line, proportional to a difference between an input signal and a first reference signal and for providing a second signal, conducted by a second signal line, proportional to a difference between the input signal and a second reference signal, an output stage having first and second transistors coupled in series between first and second power supply voltage terminals for respectively receiving the first and second signals and for providing an output signal at a node between the first and second transistors, a method of clamping voltages of the first and second signals comprising:

coupling a clamping circuit to the first signal line, said clamping circuit comprising a third transistor and a regulator coupled to said third transistor, said regulator comprising a differential amplifier;

providing a reference current through said third transistor such that a current density of said third transistor is substantially equal to a current density through the first transistor when said output signal equals a third reference voltage;

regulating a voltage at a drain of said third transistor such that a drain-to-source voltage of said third transistor is substantially equal to a drain-to-source voltage of the first transistor when said output signal equals a third reference voltage; and clamping the first signal to a voltage equal to the first power supply voltage plus a gate-to-source voltage of said third transistor.

5. The method of claim 4 further comprising:

coupling a second clamping circuit to the second signal line, said clamping circuit comprising a fourth transistor and a second regulator coupled to said fourth transistor, said second regulator comprising a second differential amplifier;

providing a reference current through said fourth transistor such that a current density of said fourth transistor is substantially equal to a current density through said second transistor when said output signal equals said third reference voltage;

regulating a voltage at a drain of said fourth transistor such that a drain-to-source voltage of said fourth transistor is substantially equal to a drain-to-source voltage of the second transistor when said output signal equals said third reference voltage; and clamping the second signal to a voltage equal to the second power supply voltage terminal plus a gate-to-source voltage of said fourth transistor.

6. An output driver circuit comprising an input stage for providing a first signal proportional to a difference between an input signal and a first reference signal and for providing a second signal proportional to a difference between the input signal and a second reference signal, an output stage having first and second transistors coupled in series between first and second power supply voltage terminals for respectively receiving the first and second signals and for providing an output signal at a node between the first and second transistors, and a clamping circuit, said clamping circuit comprising:

a clamping transistor having a first current electrode coupled to the first power supply voltage terminal, a control electrode for receiving a clamping bias signal, and a second current electrode coupled to a control electrode of the second transistor;

a third transistor having a first current electrode coupled to the first power supply voltage terminal, a control electrode for receiving said clamping bias signal, and a second current electrode;

a first current source having an first terminal coupled to said second current electrode of said third transistor, and a second terminal coupled to the second power supply voltage terminal;

a second current source having a first terminal coupled to the first power supply voltage terminal, and a second terminal;

a fourth transistor having a first current electrode coupled to said second terminal of said second current source, a control electrode coupled to said second current electrode of said third transistor, and a second current electrode coupled to the second power supply voltage terminal; and gain means coupled to said first current electrode of said fourth transistor, for changing a voltage of said clamping bias signal until a voltage on said first current electrode of said fourth transistor equals a third reference voltage.

7. The output driver circuit of claim 6 wherein said third reference voltage is substantially equal to a crossover voltage of said driver circuit.

8. The driver circuit of claim 7 wherein said fourth transistor has substantially equal current density as said second transistor and said third transistor has substantially equal current density as said clamping transistor when said output signal equals said third reference voltage.

9. The output driver circuit of claim 8 wherein said gain means comprises a differential amplifier having a negative input terminal for receiving said third reference voltage, a positive input terminal coupled to said first current electrode of said fourth transistor, and an output terminal for providing said clamping bias signal.

10. The output driver circuit of claim 9 wherein said clamping circuit further comprises:
a second clamping transistor having a first current electrode coupled to a control electrode of said first transistor, a control electrode for receiving a second clamping bias signal, and a second current electrode coupled to the second power supply voltage terminal;
a third current source having an first terminal coupled to the first power supply voltage terminal, and a second terminal;
a fifth transistor having a first current electrode coupled to the second terminal of the third current source, a control electrode for receiving said second clamping bias signal, and a second current electrode coupled to the second power supply voltage terminal;
a sixth transistor having a first current electrode coupled to the first power supply voltage terminal, a control electrode coupled to said second terminal of said third current source, and a second current electrode;
a fourth current source having a first terminal coupled to said second current electrode of said sixth transistor, and a second terminal coupled to the second power supply voltage terminal; and
second gain means coupled to said second current electrode of said sixth transistor, for changing a voltage of said second clamping bias signal until a voltage on said second current electrode of said sixth transistor equals said third reference voltage.

11. The driver circuit of claim 10 wherein said sixth transistor has substantially equal current density as said first transistor and said fifth transistor has substantially equal current density as said second clamping transistor when said output signal equals said third reference voltage.

12. The output driver circuit of claim 11 wherein said second gain means comprises a differential amplifier having a negative input terminal for receiving said third reference voltage, a positive input terminal coupled to said second current electrode of said sixth transistor, and an output terminal for providing said second clamping bias signal.

* * * * *

UNITED STATES PATENT AND TRADEMARK OFFICE
CERTIFICATE OF CORRECTION

PATENT NO. : 5,083,051
DATED : Jan. 21, 1992
INVENTOR(S) : Roger A. Whatley et al.

It is certified that error appears in the above-identified patent and that said Letters Patent is hereby corrected as shown below:

Column 8, lines 59 through 61, after "between", delete "an input signal and a first reference signal, and for providing a second signal proportional to a difference between".

Column 11, line 24, change "9", to --7--.

Signed and Sealed this

Twentieth Day of July, 1993

Attest:

MICHAEL K. KIRK

Attesting Officer

Acting Commissioner of Patents and Trademarks